(12) United States Patent
Kim et al.

(10) Patent No.: US 9,847,474 B2
(45) Date of Patent: Dec. 19, 2017

(54) ELECTRONIC DEVICE AND METHOD FOR FABRICATING THE SAME

(71) Applicant: SK hynix Inc., Icheon-Si (KR)

(72) Inventors: Jeong-Myeong Kim, Icheon-Si (KR); Yang-Kon Kim, Icheon-Si (KR); Jong-Koo Lim, Icheon-Si (KR)

(73) Assignee: SK hynix Inc., Icheon-Si (KR)

( * ) Notice: Subject to any disclaimer, the term of this patent is extended or adjusted under 35 U.S.C. 154(b) by 36 days.

(21) Appl. No.: 15/048,119

(22) Filed: Feb. 19, 2016

(65) Prior Publication Data
US 2017/0025599 A1    Jan. 26, 2017

(30) Foreign Application Priority Data
Jul. 24, 2015 (KR) .......... 10-2015-0104951

(51) Int. Cl.
| | | |
|---|---|---|
| *H01L 43/10* | (2006.01) | |
| *G11C 11/16* | (2006.01) | |
| *H01L 43/08* | (2006.01) | |
| *H01L 43/02* | (2006.01) | |
| *G06F 12/0875* | (2016.01) | |

(52) U.S. Cl.
CPC .......... *H01L 43/08* (2013.01); *G06F 12/0875* (2013.01); *G11C 11/161* (2013.01); *H01L 43/02* (2013.01); *H01L 43/10* (2013.01); *G06F 2212/451* (2013.01)

(58) Field of Classification Search
CPC ......... H01L 43/02; H01L 43/08; H01L 43/10; G11C 11/14–11/16; G11C 11/161
See application file for complete search history.

(56) References Cited

U.S. PATENT DOCUMENTS

2015/0249206 A1*  9/2015  Kim .................. H01L 43/02
                                                   257/421

FOREIGN PATENT DOCUMENTS

| KR | 10-2014-0067116 | 6/2014 |
|---|---|---|
| WO | 2013040072 A1 | 3/2013 |

* cited by examiner

*Primary Examiner* — Allison P Bernstein
(74) *Attorney, Agent, or Firm* — Perkins Coie LLP

(57) ABSTRACT

An electronic device may include a semiconductor memory. The semiconductor memory may include a variable resistance element including a ferromagnetic layer including a hydrogen group; an oxide spacer formed on sidewalls of the variable resistance element; and a nitride spacer formed on the oxide spacer.

16 Claims, 8 Drawing Sheets

ELECTRONIC DEVICE AND METHOD FOR FABRICATING THE SAME

CROSS-REFERENCE TO RELATED APPLICATION

This patent document claims priority of Korean Patent Application No. 10-2015-0104951, entitled "ELECTRONIC DEVICE AND METHOD FOR FABRICATING THE SAME" and filed on Jul. 24, 2015, which is incorporated herein by reference in its entirety.

TECHNICAL FIELD

This patent document relates to memory circuits or devices and their applications in electronic devices or systems.

BACKGROUND

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device in which a fabrication process is easy and characteristics of a variable resistance element are improved.

In one implementation aspect, an electronic device may include a semiconductor memory. The semiconductor memory may include a variable resistance element including a ferromagnetic layer including a hydrogen group; an oxide spacer formed on sidewalls of the variable resistance element; and a nitride spacer formed on the oxide spacer.

In some implementations, The variable resistance element comprises: a free layer having a variable magnetization direction; a fixed layer having a fixed magnetization direction; a tunnel barrier layer interposed between the free layer and the fixed layer; and a magnetic compensation layer, and wherein at least any one of the fixed layer and the magnetic compensation layer comprises the ferromagnetic layer including the hydrogen group. In some implementations, The ferromagnetic layer having the hydrogen group comprises a Co/Pd-Hx (x is a natural number). In some implementations, the oxide spacer comprises a Pd-OxHx (x and y are natural numbers) layer. In some implementations, the nitride spacer comprises a nitride having a density and mass greater than those of silicon-nitride. In some implementations, the nitride spacer comprises a GeN layer.

In some implementations, the electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory unit that includes the resistance variable element is part of the memory unit in the microprocessor.

In some implementations, the electronic device may further comprising a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit that includes the resistance variable element is part of the cache memory unit in the processor.

In some implementations, the electronic device may further comprising a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory unit that includes the resistance variable element is part of the auxiliary memory device or the main memory device in the processing system.

In some implementations, the electronic device may further comprising a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit that includes the resistance variable element is part of the storage device or the temporary storage device in the data storage system.

In some implementations, the electronic device may further comprising a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit that includes the resistance variable element is part of the memory or the buffer memory in the memory system.

In another implementation aspect, an electronic device may include a semiconductor memory. The semiconductor memory may include a substrate; a magnetic tunnel junction formed over the substrate and including a free layer having a variable magnetization direction, a fixed layer having a fixed magnetization direction, and a tunnel barrier layer interposed between the free layer and the fixed layer; a magnetic compensation layer adjacent to the magnetic tunnel junction and configured to produce a magnetic field at the free layer to offset a stray magnetic field produced by the fixed layer at the free layer; and a spacer formed on sidewalls of the magnetic tunnel junction and the magnetic compensation layer and including a nitride, wherein at least one of the fixed layer of the magnetic tunnel junction and the magnetic compensation layer is configured to be susceptible to oxidation.

In some implementations, the ferromagnetic layer comprises a Co/Pd-Hx layer (x is a natural number). In some implementations, The electronic device may further comprise an oxide spacer formed between the sidewalls of the magnetic tunnel junction and the magnetic compensation layer and the spacer. In some implementations, The spacer has a density and mass greater than those of silicon-nitride. In some implementations, The spacer further comprises a germanium.

In an implementation another aspect, a method for fabricating an electronic device including a semiconductor memory is provided, The method includes: forming a variable resistance layer including a ferromagnetic layer including a hydrogen group; patterning the variable resistance layer to form a variable resistance element which has a residue on sidewalls of the variable resistance element; forming an oxide spacer by oxidizing the residue; and forming a nitride spacer over the oxide spacer.

In some implementations, the variable resistance layer comprises a magnetic compensation layer, a free layer, a tunnel barrier layer and a fixed layer, and at least any one of the magnetic compensation layer and the fixed layer comprises the ferromagnetic layer including the hydrogen group. In some implementations, the forming of the variable resistance element includes performing ion beam etching. In some implementations, the ferromagnetic layer including the hydrogen group comprises a Co/Pd-Hx (x is a natural number). In some implementations, the oxide spacer comprises a Pd-OxHx (x and y are natural numbers) layer. In some implementations, the nitride spacer comprises a nitride having the density and mass greater than those of silicon-nitride. In some implementations, the nitride spacer comprises a GeN layer.

DETAILED DESCRIPTION

Figure 1:
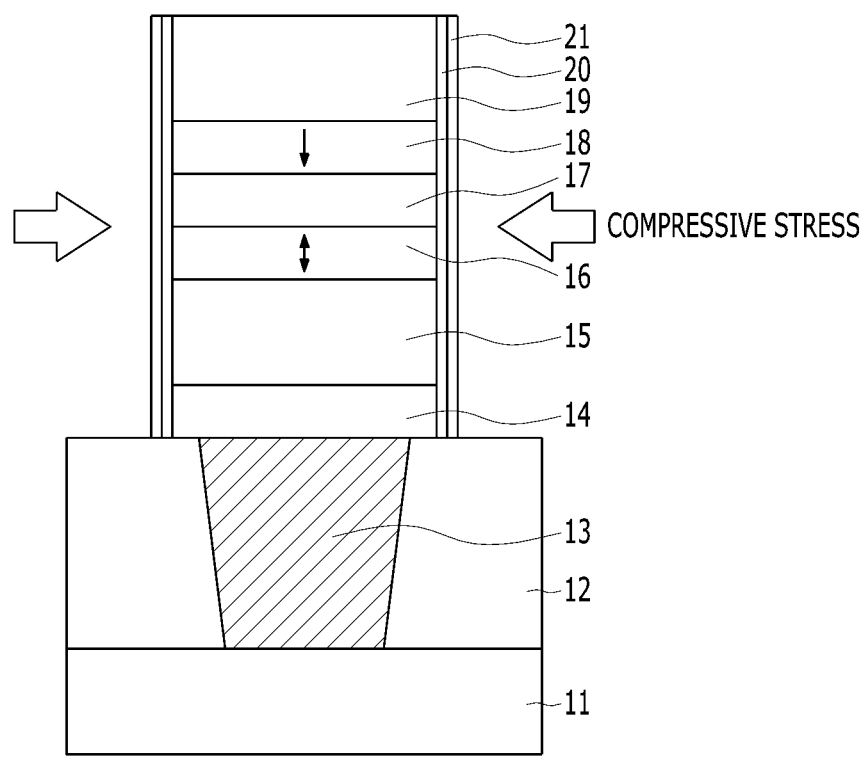
FIG. 1 is a cross-sectional view illustrating an exemplary semiconductor device in accordance with an implementation.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Figure 2:
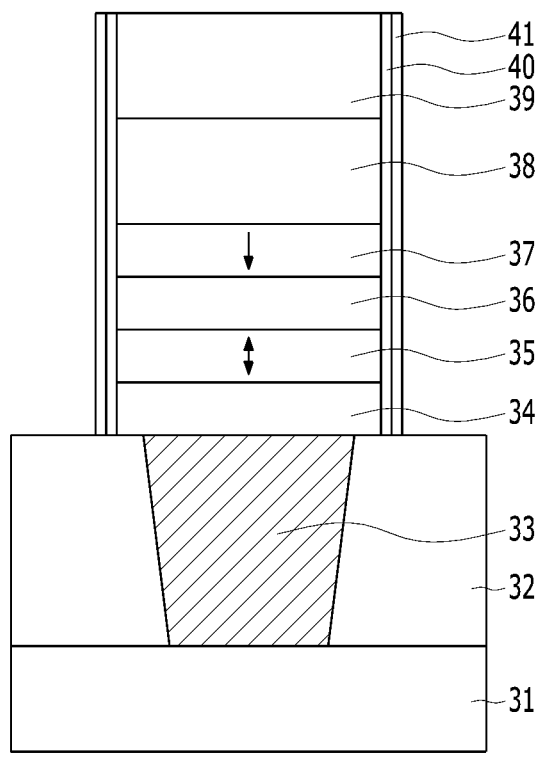
FIG. 2 is a cross-sectional view illustrating an exemplary semiconductor device in accordance with another implementation.
Figure 3:
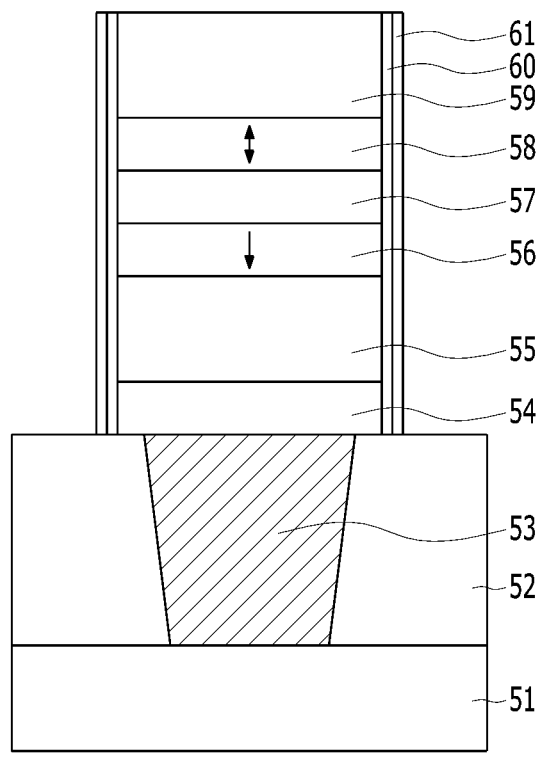
FIG. 3 is a cross-sectional view illustrating an exemplary semiconductor device in accordance with the other implementation.

FIG. 1 is a cross-sectional view illustrating a semiconductor device in accordance with an implementation. FIG. 2 is a cross-sectional view illustrating a semiconductor device in accordance with another implementation. FIG. 3 is a cross-sectional view illustrating a semiconductor device in accordance with the other implementation.

As illustrated in FIG. 1, an interlayer dielectric layer 12 including a lower electrode contact 13 may be formed on a substrate 11. A variable resistance element in contact with the lower electrode contact 13 may be formed. In the present implementation, the variable resistance element may include a stacked structure including a lower layer 14, a magnetic compensation layer 15, a free layer 16, a tunnel barrier layer 17, a fixed layer 18 and a hard mask layer 19. The free layer 16, the tunnel barrier layer 17 and the fixed layer 18 may form a magnetic tunnel junction. The variable resistance element may further include an oxide spacer 20 and a nitride spacer 21 on sidewalls of the stacked structure.

The substrate 11 may include a semiconductor substrate in which a desired bottom structure, for example, a switching element, is formed. The switching element is for selecting a specific unit cell in the semiconductor device having a plurality of unit cells. The switching element may include a transistor, a diode, or others. One end of the switching element may be electrically coupled to the lower electrode contact 13, and another end of the switching element may be electrically coupled to a source line through a source line contact.

The interlayer dielectric layer 12 may include dielectric materials. The interlayer dielectric layer 12 may include a single-layered structure including an oxide layer, a nitride layer or an oxynitride layer or a stacked structure including any combination of the oxide layer, the nitride layer or the oxynitride layer.

The lower electrode contact 13 formed under the variable resistance element and provides a passage for applying a voltage or current to the variable resistance element. The lower electrode contact 13 may include various conductive materials such as a metal, a metal-nitride or others. In the present implementation, a line width of the lower electrode contact 13 is smaller than a line width of the variable resistance element. However, other implementations are possible, and if necessary, the line width of the lower electrode contact 13 may be equal to or greater than the line width of the variable resistance element.

The lower layer 14 may include multiple layers including a template layer, a bonding layer, an interface layer for improving characteristics of the variable resistance element. The lower layer 14 may have a single-layered structure or a multilayered structure. The lower layer 14 may include an electrode for applying a voltage and current to the variable resistance element.

The magnetic compensation layer 15 may serve to offset the effect of the stray field which is generated by the fixed layer 18. The magnetic compensation layer 15 may reduce a bias magnetic field in the free layer 16 by reducing the impact of the stray field of the fixed layer 18 on the free layer 16. The magnetic compensation layer 15 may include a ferromagnetic layer having a hydrogen group. The magnetic compensation layer 15 including the ferromagnetic layer may be susceptible to oxidation. The magnetic compensation layer 15 may include, for example, a Co/Pd-Hx (x is a natural number) layer.

The free layer 16 has a variable magnetization direction and configured to store data in accordance with a magnetization direction of the free layer 16. Thus, the free layer 16 may be referred as a storage layer.

The fixed layer 18 has a fixed magnetization direction unlike the free layer 16 having the variable magnetization direction. Thus, the fixed layer 18 may be referred as a reference layer.

The magnetization direction of the free layer 16 may be changed according to a current or voltage applied to the variable resistance element, and thus the magnetization direction of the free layer 16 may be in parallel or anti-parallel to the magnetization direction of the fixed layer 18. Accordingly, the variable resistance element may be switched between a high resistance state and low resistance state, and store different data. That is, the variable resistance element may be functioned as a memory cell.

The free layer 16 and the fixed layer 18 may include magnetic materials and have a single-layered structure or a multilayered structure. The variation in the magnetization direction of the free layer 16 may depend upon a spin transfer torque. The free layer 16 and the fixed layer 18 may have the magnetization direction perpendicular to the surfaces thereof. For example, as illustrated by an arrow in FIG. 1, the magnetization direction of the free layer 16 may be changed between an upward direction and a downward direction. The magnetization direction of the fixed layer 18 may be fixed in a direction toward the bottom from the top.

The magnetization direction of the magnetic compensation layer 15 is opposite to that of the fixed layer 18. Thus, when the fixed layer 18 has the downward magnetization direction, the magnetic compensation layer 15 has the upward magnetization direction. However, the present implementation is not limited to such an example, and in another implementation, the fixed layer 18 has the upward magnetization direction and the magnetic compensation layer 15 has the downward magnetization direction.

The free layer 16 and the fixed layer 18 may have a single-layered structure or a multilayered structure. The free layer 16 and the fixed layer 18 may include various ferromagnetic materials, such as a Fe—Pt alloy, a Fe—Pd alloy, a Co—Pd alloy, a Co—Pt alloy, a Co—Fe alloy, a Fe—Ni—Pt alloy, a Co—Fe—Pt alloy, a Co—Ni—Pt alloy or others.

In the present implementation, the fixed layer 18 may include a ferromagnetic layer including a hydrogen group. That is, the fixed layer 18 may include the ferromagnetic layer which is susceptible to oxidation. The fixed layer 18 may include, for example, a Co/Pd-Hx (x is a natural number) layer. Although it has been described that the fixed layer 18 includes the ferromagnetic layer including the hydrogen group, in some implementations, any one of the fixed layer 18 and the magnetic compensation layer 15 may include the ferromagnetic layer having the hydrogen group. In some implementations, both the fixed layer 18 and the magnetic compensation layer 15 may include the ferromagnetic layer including the hydrogen group.

The tunnel barrier layer 17 may serve to change the magnetization direction of the free layer 16 by enabling tunneling of an electron. The tunnel barrier layer 17 may have a single-layered structure or a multilayered structure and include an oxide, such as $Al_2O_3$, MgO, CaO, SrO, TiO, VO, NbO and so forth.

The hard mask layer 19 may serve as an etching mask when the variable resistance element is patterned. The hard mask layer 19 may include an electrode for applying a voltage or current to the variable resistance element.

In the example shown in FIG. 1, the oxide spacer 20 and the nitride spacer 21 are formed on the side wall of the layers 14, 15, 16, 17, 18 and 19 of the variable resistance element to protect the variable resistance element and apply a stress to the variable resistance element to change lattice structure of the free layer 16.

When the fixed layer 18 and the magnetic compensation layer 15 are patterned to form the variable resistance element, etching residues of the fixed layer 18 and the magnetic compensation layer 15 are re-deposited on sidewalls of the variable resistance element. The oxide spacer 20 may be formed by oxidizing the etching residues of the fixed layer 18 and the magnetic compensation layer 15. Specifically, in the present implementation, by forming at least any one of the fixed layer 18 and the magnetic compensation layer 15 including the ferromagnetic layer having the hydrogen group, the variable resistance element has a characteristic that is susceptible to oxidation. Thus, it is possible to completely oxidize the etching residues which are re-deposited on sidewalls of the variable resistance element as the result of the patterning of the fixed layer 18 and the magnetic compensation layer 15. Thus, it is also possible to prevent the interlayer shunt of the variable resistance element, thereby improving the electromagnetic characteristics. In some implementations, the oxide spacer 20 may include a Pd-OxHy (x and y are natural numbers) layer.

The nitride spacer 21 may serve to improve magnetic characteristics by applying a tensile stress to the variable resistance element. In the present implementation, the nitride spacer 21 may include a nitride of which the density and mass are greater than those of silicon nitride for applying the tensile stress greater than that of silicon nitride. For example, the nitride spacer 21 may include a GeN layer. Upon comparison of the characteristics of the material, silicon Si has the radius of 117.6 pm and the mass of 28.08 g/mol and germanium Ge has the radius of 125 pm and the mass of 74.46 g/mol. Also, the mass of silicon-nitride Si3N4 in which silicon and nitride are combined is 140.28 g/mol and the density thereof is 3.2 g/cm3. The mass of germanium-nitride Ge3N4 in which germanium and nitride are combined is 273.947 g/mol and the density is 5.25 g/cm3.

The Germanium-nitride material can have density and mass greater than those of a silicon-nitride material and may apply a greater compressive stress. Therefore, the magnetic characteristics of the variable resistance element may be improved.

FIGS. 2 and 3 illustrate other implementations of a variable resistance element. As shown in FIGS. 2 and 3, a magnetic compensation layer 38 or 55, a free layer 35 or 58 and a fixed layer 37 or 56 can be located in various positions while not being fixed to the particular position. Further, the stacking order of the magnetic compensation layer 38 or 55, the free layer 35 or 58 and the fixed layer 37 or 56 may be changed in other orders different from what is shown. The position of a tunnel barrier layer 36 or 57 may be interposed between the free layer 35 or 58 and the fixed layer 37 or 56. Similar to FIG. 1 in which the oxide spacer 20 and the nitride spacer 21 are provided to protect the variable resistance element and apply a stress to the variable resistance element to change lattice structure of the free layer, the oxide spacer 40 and the nitride spacer 41 in FIG. 2 and the oxide spacer 60 and the nitride spacer 61 n FIG. 3 provide such functions.

Figure 4:
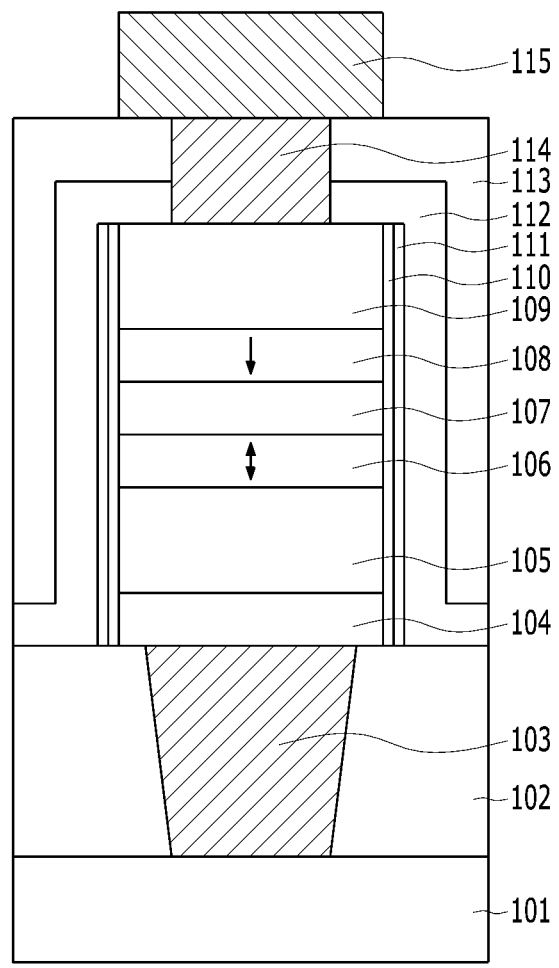
FIG. 4 is a cross-sectional view illustrating an exemplary memory device, which is used for explaining an exemplary method for fabricating the same in accordance with an implementation.

FIG. 4 is a cross-sectional view of an exemplary memory device. The memory device may further include various components, such as an interconnection, an element and others, for driving of both ends of a variable resistance element.

As illustrated in FIG. 4, the memory device may include a lower electrode contact 103 which is formed on the substrate 101 to pass through a first interlayer dielectric layer 102 to be in contact with a substrate 101. The memory device may include the variable resistance element in contact with the lower electrode contact 103. The memory device may include the variable resistance element having a stacked structure in which a lower layer 104, a magnetic compensation layer 105, a free layer 106, a tunnel barrier layer 107, a fixed layer 108 and a hard mask layer 109 are stacked. The variable resistance element may further include an oxide spacer 110 and a nitride spacer 111 on sidewalls of the stacked structure. The variable resistance element may include a capping layer 112 which is formed along the entire structure including the variable resistance element. The variable resistance element may further include an upper electrode contact 114 which is in contact with the variable resistance element through a second interlayer dielectric layer 113 and the capping layer 112 and a metal interconnection 115 which is electrically coupled to the upper electrode contact 114.

The elements of FIG. 4 including the substrate 101, the first interlayer dielectric layer 102, the lower electrode contact 103, the lower layer 104, the magnetic compensation layer 105, the free layer 106, the tunnel barrier layer 107, the fixed layer 108, the hard mask layer 109, the oxide spacer 110 and the nitride spacer 111 may be the same as those of FIG. 1 including the substrate 11, the interlayer dielectric layer 12, the lower electrode contact 13, the lower layer 14, the magnetic compensation layer 15, the free layer 16, the tunnel barrier layer 17, the fixed layer 18, the hard mask layer 19, the oxide spacer 20 and the nitride spacer 21. The oxide spacer 110 and the nitride spacer 111 are provided to protect the variable resistance element and apply a stress to the variable resistance element to change lattice structure of the free layer. Also, in the present implementation, the memory device has been described to have the variable resistance element with the same stacked structure as that of FIG. 1. However, the present implementation is not limited to such an example, and thus, it is possible to form the memory device having different stacked structures from FIGS. 2 and 3.

The capping layer 112 and the second interlayer dielectric layer 113 may serve to protect the variable resistance element and separate the variable resistance elements. For example, the capping layer 112 may include a nitride and the second interlayer dielectric layer 113 may include an oxide.

The upper electrode contact 114 may serve to electrically couple the metal interconnection 115 and the variable resistance element. At the same time, the upper electrode contact 114 may serve as an electrode of the variable resistance element. The upper electrode contact 114 may be formed of or including the same material as the lower electrode contact 103.

The metal interconnection 115 may serve as a bit line for applying a voltage and current to the variable resistance element. The metal interconnection 115 may include, for example, a metal layer. The metal layer may refer to a conductor layer including a metal element, such as a metal layer, a metal oxide layer, a metal-nitride layer, a metal-oxytride layer, a metal silicide layer, or others.

The memory device may be formed by the following method.

At first, a substrate having a predetermined structure, for example, a switching element, may be provided, and the first interlayer dielectric layer 102 may be formed on the substrate 101. A contact hole may be formed to pass through the first interlayer dielectric layer 102 and expose the substrate 101. The lower electrode contact 103 may be formed by filling the hole with a conductive material. The material layers for forming the variable resistance element may be formed on the lower electrode contact 103 and the first interlayer dielectric layer 102. The variable resistance element may be formed by patterning the material layers. For example, the material layers for forming the variable resistance element may include the lower layer 104, the magnetic compensation layer 105, the free layer 106, the tunnel barrier layer 107, the fixed layer 108 and the hard mask layer 109. In the present implementation, at least any one of the magnetic compensation layer 105 and the fixed layer 108 may include the ferromagnetic layer including the hydrogen group. Thus, the ferromagnetic layer has a characteristic which is susceptible to oxidation. During the patterning of the fixed layer 108 and the magnetic compensation layer 105, etching residues of the fixed layer 108 and the magnetic compensation layer 105 are re-deposited on sidewalls of the variable resistance element. The oxide spacer 110 may be formed by oxidizing the etching residues. By forming at least any one of the fixed layer 108 and the magnetic compensation layer 105 including the ferromagnetic layer having the hydrogen group, the etching residues, which are re-deposited on sidewalls of the variable resistance element when the fixed layer 108 and the magnetic compensation layer 105 are patterned, can be completely oxidized. Thus, it is possible to prevent the interlayer shunt of the variable resistance element, thereby improving the electromagnetic characteristics. The patterning process for forming the variable resistance element may be performed, for example, by ion beam etching. The ion beam etching may be performed in a way that a tilt etching process and a vertical etching process proceed separately from each other to adjust the amount of the residue re-deposited on sidewalls of the variable resistance element.

The nitride spacer 111 may be formed on the oxide spacer 110. The capping layer 112 may be formed along the entire structure including the nitride spacer 111. The second interlayer dielectric layer 113 may be formed to be filled between the variable resistance elements on the capping layer 112. The hole may be formed to pass through the second interlayer dielectric layer 113 and the capping layer 112 and expose a portion of the variable resistance element may be formed. The upper electrode contact 114 may be formed by filling the hole with conductive materials. The metal interconnection 115 may be formed on the upper electrode contact 114 and the second interlayer dielectric layer 113.

The above and other memory circuits or semiconductor devices based on the disclosed technology can be used in a range of devices or systems. FIGS. 5-9 provide some examples of devices or systems that can implement the memory circuits disclosed herein.

Figure 5:
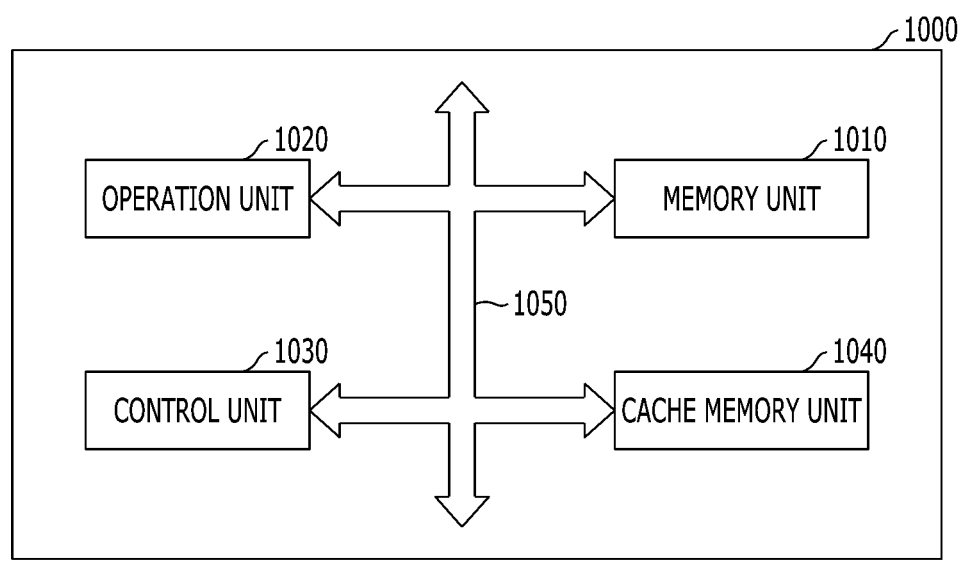
FIG. 5 is an example of configuration diagram of a microprocessor implementing memory circuitry based on the disclosed technology.

FIG. 5 is an example of configuration diagram of a microprocessor implementing memory circuitry based on the disclosed technology.

Referring to FIG. 5, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a variable resistance element including a ferromagnetic layer including a hydrogen group; an oxide spacer formed on sidewalls of the variable resistance element; and a nitride spacer formed on the oxide spacer. Through this, a fabrication process of the memory unit 1010 may become easy and the reliability and yield of the memory unit 1010 may be improved. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 6:
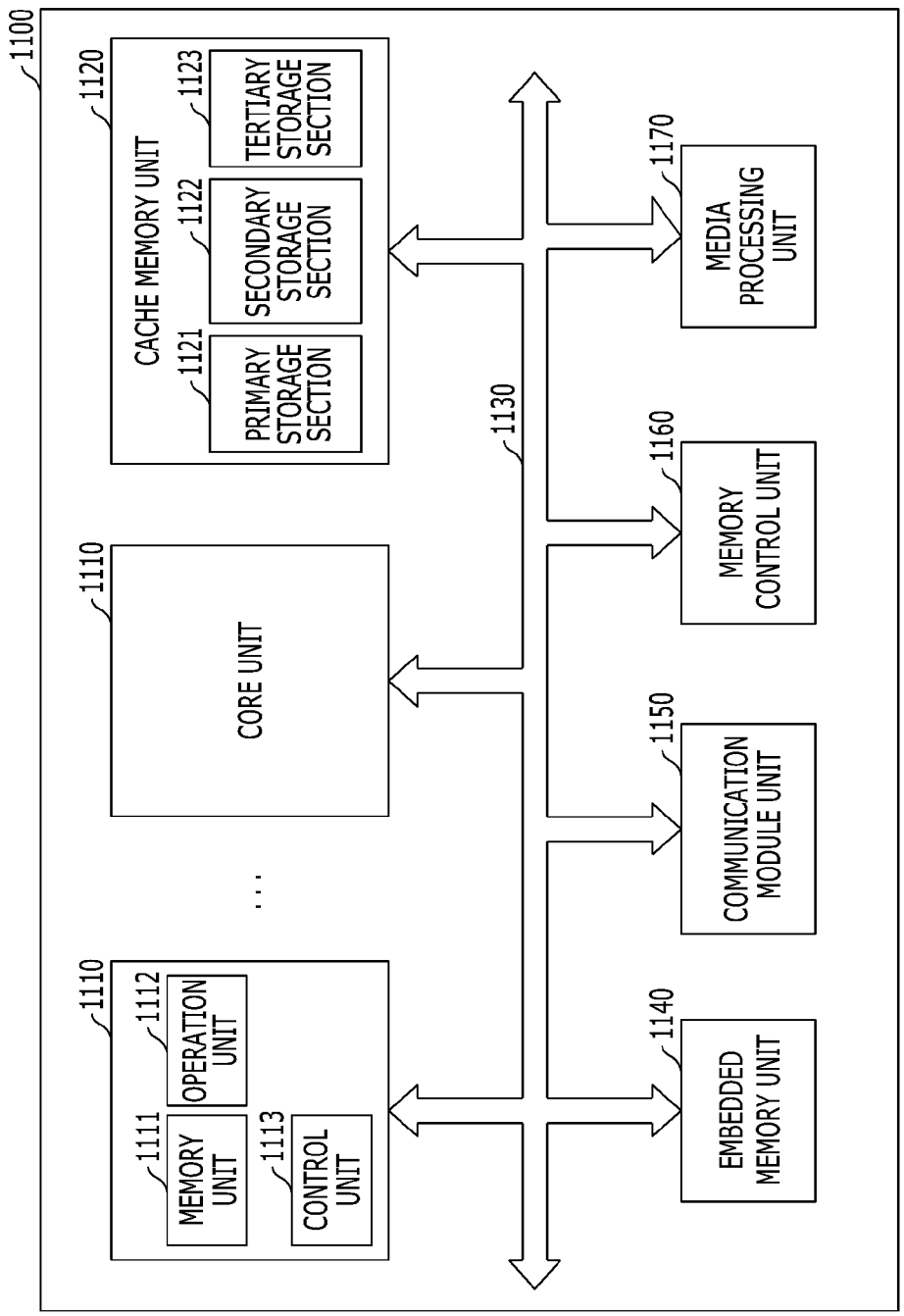
FIG. 6 is an example of configuration diagram of a processor implementing memory circuitry based on the disclosed technology.

FIG. 6 is an example of configuration diagram of a processor implementing memory circuitry based on the disclosed technology.

Referring to FIG. 6, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a variable resistance element including a ferromagnetic layer including a hydrogen group; an oxide spacer formed on sidewalls of the variable resistance element; and a nitride spacer formed on the oxide spacer. Through this, a fabrication process of the cache memory unit 1120 may become easy and the reliability and yield of the cache memory unit 1120 may be improved. As a consequence, operating characteristics of the processor 1100 may be improved.

Although it was shown in FIG. 6 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and soon.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 7:
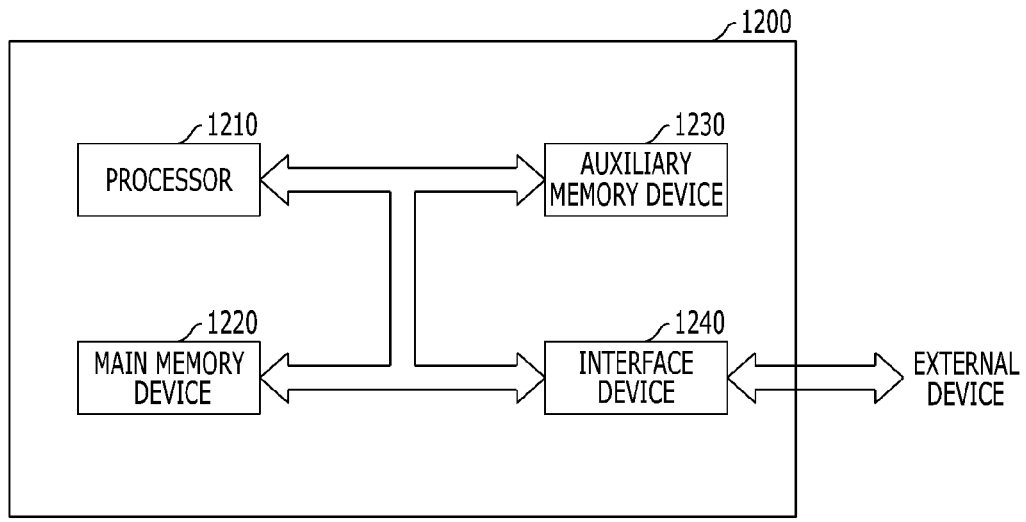
FIG. 7 is an example of configuration diagram of a system implementing memory circuitry based on the disclosed technology.

FIG. 7 is an example of configuration diagram of a system implementing memory circuitry based on the disclosed technology.

Referring to FIG. 7, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a variable resistance element including a ferromagnetic layer including a hydrogen group; an oxide spacer formed on sidewalls of the variable resistance element; and a nitride spacer formed on the oxide spacer. Through this, a fabrication process of the main memory device 1220 may become easy and the reliability and yield of the main memory device 1220 may be improved. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a variable resistance element including a ferromagnetic layer including a hydrogen group; an oxide spacer formed on sidewalls of the variable resistance element; and a nitride spacer formed on the oxide spacer. Through this, a fabrication process of the auxiliary memory device 1230 may become easy and the reliability and yield of the auxiliary memory device 1230 may be improved. As a consequence, operating characteristics of the system 1200 may be improved.

Also, the auxiliary memory device 1230 may further include a data storage system (see the reference numeral 1300 of FIG. 8) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 8) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 8:
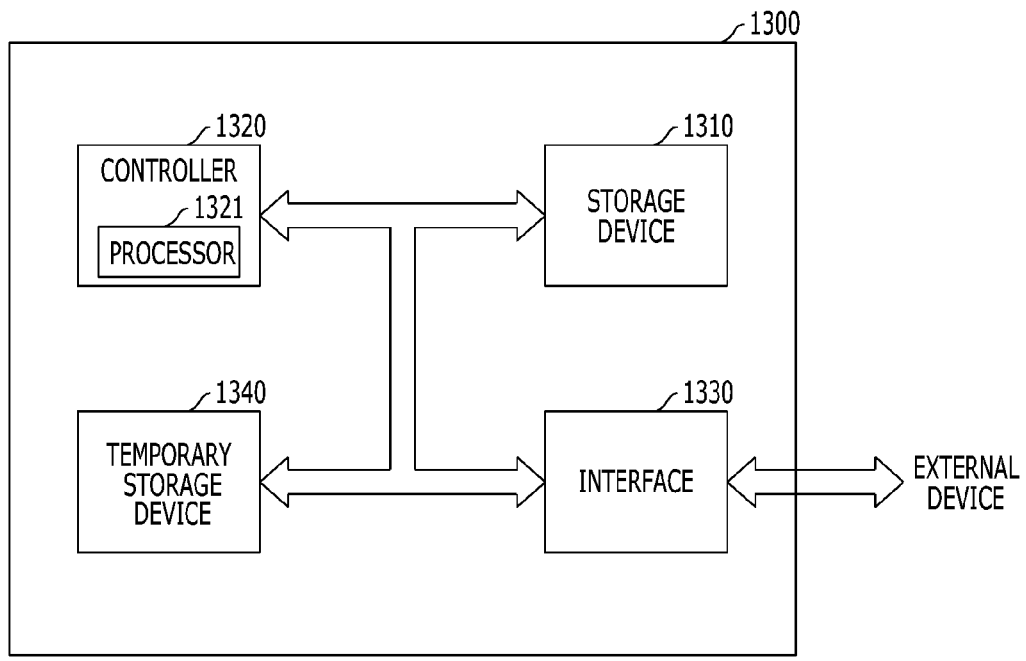
FIG. 8 is an example of configuration diagram of a data storage system implementing memory circuitry based on the disclosed technology.

FIG. 8 is an example of configuration diagram of a data storage system implementing memory circuitry based on the disclosed technology.

Referring to FIG. 8, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a variable resistance element including a ferromagnetic layer including a hydrogen group; an oxide spacer formed on sidewalls of the variable resistance element; and a nitride spacer formed on the oxide spacer. Through this, a fabrication process of the storage device 1310 or the temporary storage device 1340 may become easy and the reliability and yield of the storage device 1310 or the temporary storage device 1340 may be improved. As a consequence, operating characteristics and data storage characteristics of the data storage system 1300 may be improved.

Figure 9:
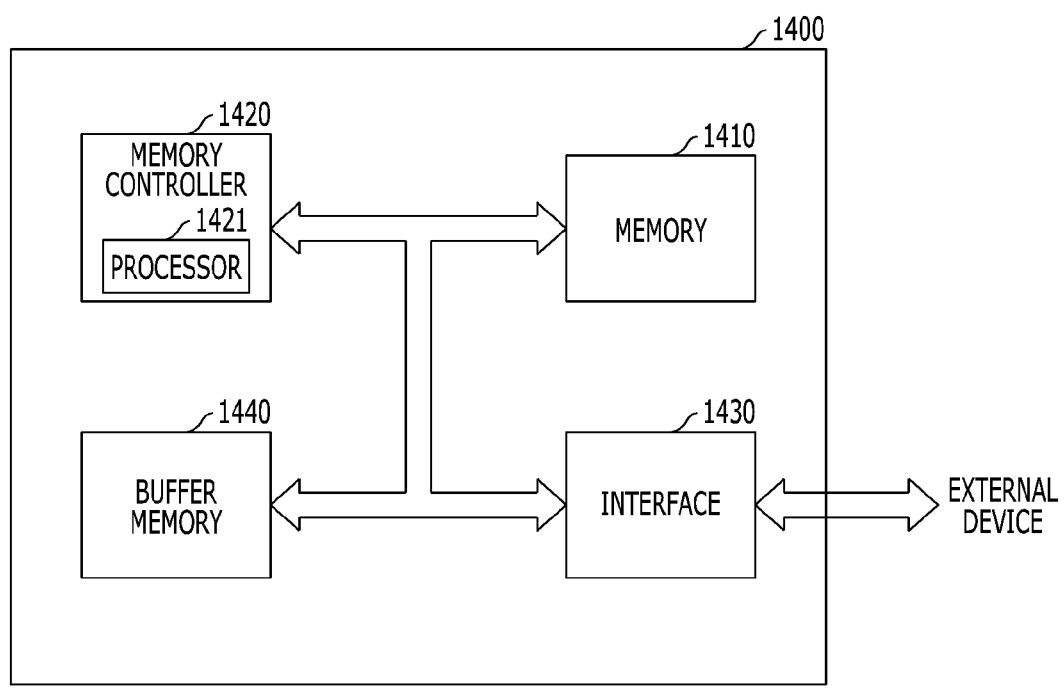
FIG. 9 is an example of configuration diagram of a memory system implementing memory circuitry based on the disclosed technology.

FIG. 9 is an example of configuration diagram of a memory system implementing memory circuitry based on the disclosed technology.

Referring to FIG. 9, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a variable resistance element including a ferromagnetic layer including a hydrogen group; an oxide spacer formed on sidewalls of the variable resistance element; and a nitride spacer formed on the oxide spacer. Through this, a fabrication process of the memory 1410 may become easy and the reliability and yield of the memory 1410 may be improved. As a consequence, operating characteristics and data storage characteristics of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may a variable resistance element including a variable resistance element including a ferromagnetic layer including a hydrogen group; an oxide spacer formed on sidewalls of the variable resistance element; and a nitride spacer formed on the oxide spacer. Through this, a fabrication process of the buffer memory 1440 may become easy and the reliability and yield of the buffer memory 1440 may be improved. As a consequence, operating characteristics and data storage characteristics of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

As is apparent from the above descriptions, in the semiconductor device and the method for fabricating the same in accordance with the implementations, patterning of a resistance variable element is easy, and it is possible to secure the characteristics of the resistance variable element.

Features in the above examples of electronic devices or systems in FIGS. 5-9 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device including a semiconductor memory, the semiconductor memory comprising:
a variable resistance element including a ferromagnetic layer including a hydrogen group;
an oxide spacer formed on sidewalls of the variable resistance element; and
a nitride spacer formed on the oxide spacer.

2. The electronic device of claim 1,
wherein the variable resistance element comprises:
a free layer having a variable magnetization direction;
a fixed layer having a fixed magnetization direction;
a tunnel barrier layer interposed between the free layer and the fixed layer; and
a magnetic compensation layer, and
wherein at least any one of the fixed layer and the magnetic compensation layer comprises the ferromagnetic layer including the hydrogen group.

3. The electronic device of claim 1, wherein the ferromagnetic layer having the hydrogen group comprises a Co/Pd-Hx (x is a natural number).

4. The electronic device of claim 1, wherein the oxide spacer comprises a Pd-OxHx (x and y are natural numbers) layer.

5. The electronic device of claim 1, wherein the nitride spacer comprises a nitride having a density and mass greater than those of silicon-nitride.

6. The electronic device of claim 1, wherein the nitride spacer comprises a GeN layer.

7. The electronic device according to claim 1, further comprising a microprocessor which includes:
a control unit configured to receive a signal including a command from an outside of the microprocessor, and performs extracting, decoding of the command, or controlling input or output of a signal of the microprocessor;
an operation unit configured to perform an operation based on a result that the control unit decodes the command; and
a memory unit configured to store data for performing the operation, data corresponding to a result of performing the operation, or an address of data for which the operation is performed,
wherein the semiconductor memory unit that includes the resistance variable element is part of the memory unit in the microprocessor.

8. The electronic device according to claim 1, further comprising a processor which includes:
a core unit configured to perform, based on a command inputted from an outside of the processor, an operation corresponding to the command, by using data;
a cache memory unit configured to store data for performing the operation, data corresponding to a result of performing the operation, or an address of data for which the operation is performed; and
a bus interface connected between the core unit and the cache memory unit, and configured to transmit data between the core unit and the cache memory unit,
wherein the semiconductor memory unit that includes the resistance variable element is part of the cache memory unit in the processor.

9. The electronic device according to claim 1, further comprising a processing system which includes:
a processor configured to decode a command received by the processor and control an operation for information based on a result of decoding the command;
an auxiliary memory device configured to store a program for decoding the command and the information;
a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory unit that includes the resistance variable element is part of the auxiliary memory device or the main memory device in the processing system.

10. The electronic device according to claim 1, further comprising a data storage system which includes:
   a storage device configured to store data and conserve stored data regardless of power supply;
   a controller configured to control input and output of data to and from the storage device according to a command inputted form an outside;
   a temporary storage device configured to temporarily store data exchanged between the storage device and the outside; and
   an interface configured to perform communication between at least one of the storage device, the controller and the temporary storage device and the outside,
   wherein the semiconductor memory unit that includes the resistance variable element is part of the storage device or the temporary storage device in the data storage system.

11. The electronic device according to claim 1, further comprising a memory system which includes:
   a memory configured to store data and conserve stored data regardless of power supply;
   a memory controller configured to control input and output of data to and from the memory according to a command inputted form an outside;
   a buffer memory configured to buffer data exchanged between the memory and the outside; and
   an interface configured to perform communication between at least one of the memory, the memory controller and the buffer memory and the outside,
   wherein the semiconductor memory unit that includes the resistance variable element is part of the memory or the buffer memory in the memory system.

12. An electronic device including a semiconductor memory, the semiconductor memory comprising:
   a substrate;
   a magnetic tunnel junction formed over the substrate and including a free layer having a variable magnetization direction, a fixed layer having a fixed magnetization direction, and a tunnel barrier layer interposed between the free layer and the fixed layer;
   a magnetic compensation layer adjacent to the magnetic tunnel junction and configured to produce a magnetic field at the free layer to offset a stray magnetic field produced by the fixed layer at the free layer; and
   a spacer formed on sidewalls of the magnetic tunnel junction and the magnetic compensation layer and including a nitride,
   wherein at least one of the fixed layer of the magnetic tunnel junction and the magnetic compensation layer is configured to be susceptible to oxidation.

13. The electronic device of claim 12, wherein at least one of the fixed layer and the magnetic compensation layer comprises a ferromagnetic layer; and wherein the ferromagnetic layer comprises a Co/Pd-Hx layer (x is a natural number).

14. The electronic device of claim 12, further comprises an oxide spacer formed between the sidewalls of the magnetic tunnel junction and the magnetic compensation layer and the spacer.

15. The electronic device of claim 12, wherein the spacer has a density and mass greater than those of silicon-nitride.

16. The electronic device of claim 12, wherein the spacer further comprises germanium.

* * * * *